US008860177B2

(12) United States Patent  
Jang

(10) Patent No.: US 8,860,177 B2  
(45) Date of Patent: Oct. 14, 2014

(54) SEMICONDUCTOR DEVICE AND METHOD FOR MANUFACTURING THE SAME

(71) Applicant: SK hynix Inc., Icheon-si (KR)

(72) Inventor: Chi Hwan Jang, Icheon-si (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 13/719,075

(22) Filed: Dec. 18, 2012

(65) Prior Publication Data

US 2014/0061802 A1    Mar. 6, 2014

(30) Foreign Application Priority Data

Aug. 28, 2012  (KR) .................. 10-2012-0094224

(51) Int. Cl.
*H01L 23/52* (2006.01)
*H01L 29/40* (2006.01)
*H01L 23/525* (2006.01)
*H01L 29/78* (2006.01)

(52) U.S. Cl.
CPC .............. *H01L 29/78* (2013.01); *H01L 29/401* (2013.01); *H01L 23/5252* (2013.01)
USPC .................. 257/530; 257/369; 257/E21.632; 257/E27.062

(58) Field of Classification Search
CPC ............................. H01L 29/78; H01L 29/401
USPC .................................................. 257/530, 369
See application file for complete search history.

(56) References Cited

U.S. PATENT DOCUMENTS

| 4,423,431 | A  | * | 12/1983 | Sasaki ........................... 257/272 |
| 6,897,543 | B1 | * | 5/2005  | Huang et al. .................. 257/530 |
| 2008/0277756 | A1 | * | 11/2008 | Min et al. ...................... 257/529 |
| 2009/0104749 | A1 | * | 4/2009  | Sung et al. .................... 438/396 |
| 2012/0044741 | A1 | * | 2/2012  | Takaoka et al. ............... 365/103 |
| 2012/0314473 | A1 | * | 12/2012 | Chung ............................. 365/96 |
| 2013/0062703 | A1 | * | 3/2013  | Agam et al. ................... 257/369 |
| 2014/0015104 | A1 | * | 1/2014  | Su et al. ........................ 257/611 |

FOREIGN PATENT DOCUMENTS

| KR | 1020110040097 A | 4/2011 |
| KR | 1020110102714 A | 9/2011 |
| KR | 1020120002750 A | 1/2012 |
| KR | 2012-131502      | * 12/2012 |

* cited by examiner

*Primary Examiner* — A. Sefer

(57) ABSTRACT

An antifuse of a semiconductor device includes a semiconductor substrate including a device isolation layer and an active region, a gate structure extending across an interface between the device isolation layer and the active region, a contact coupled to at least a portion of a sidewall of the gate structure, and a metal interconnection provided on the contact and gate structure.

14 Claims, 5 Drawing Sheets

SEMICONDUCTOR DEVICE AND METHOD FOR MANUFACTURING THE SAME

CROSS-REFERENCES TO RELATED APPLICATION

The present application claims priority to Korean patent application number 10-2012-0094224, filed on 28 Aug. 2012, which is incorporated by reference in its entirety.

BACKGROUND OF THE INVENTION

Defective memory cells in a semiconductor device can compromise the functionality of a semiconductor device, in particular a memory device, resulting in a defective product. To improve production yields, semiconductor memory devices are manufactured with redundant memory cells. When defective memory cells are detected, they may be replaced by the redundant cells.

Redundant memory cell sectors include redundant rows and columns which can be used to replace rows and columns which include defective cells. For example, when a defective memory cell is detected through a test after fabrication, a program operation, which replaces an address of the defective memory cell with an address of the redundancy cell, is performed in an internal circuit. Therefore, when an address signal corresponding to a defective line is input in actual use of the semiconductor memory apparatus, the redundant line is accessed other than the defective line.

Conventional repair methods use fuse operations. Since repairing a semiconductor device using a fuse operation is performed at a wafer level, the method cannot applied be when a defective cell is detected after the device is packaged. Therefore, an antifuse method is used to replace cells after packaging.

In general, an antifuse has an electric characteristic opposite to a fuse. That is, the antifuse device is generally a resistive fuse device which has high resistance in an initial state and low resistance after a programming operation. An antifuse may use a very thin dielectric material such as silicon oxide ($SiO_2$), silicon nitride, tantalum oxide, or silicon dioxide—silicon nitride—silicon dioxide (ONO) interposed between two conductors.

The programming operation of the antifuse device includes breaking down the dielectric between the two conductors by applying a high voltage through antifuse terminals for a sufficient period of time. Therefore, when the antifuse is programmed, the conductor at both edges of the antifuse is short-circuited so that the antifuse has a low resistance. Therefore, the antifuse is electrically open in a normal state and electrically short-circuited in a programmed state by applying a high voltage.

For example, an antifuse may include a gate formed on a gate insulating layer, a contact plug formed to be spaced from the gate at a fixed distance, and a conductive interconnection connected to a top of the contact plug, and is programmed by breaking down the gate insulating layer by applying a high voltage between the gate and the contact plug.

When a gate insulating layer provided in an edge of an active region is broken down in an antifuse programming operation, an interface between the semiconductor device and the gate may become reoxidized in subsequent thermal processes, reducing the reliability of the antifuse operation.

Furthermore, when a gate size is increased to improve reliability and stability of the antifuse, a corresponding antifuse area is also increased, reducing productivity of a net die.

BRIEF SUMMARY OF INVENTION

According to an embodiment of the present invention, an antifuse unit is provided in a semiconductor device. The antifuse unit may include a semiconductor substrate including a device isolation layer and an active region; a gate structure extending across an interface between the device isolation layer and the active region, the gate structure including a layer that is configured to be ruptured in an antifuse operation; a contact disposed over a sidewall of the gate structure; and a metal interconnection provided on the contact and the gate structure.

The contact may surround all sidewalls of the gate structure.

The contact may be disposed over two sidewalls of the gate structure.

The gate structure may include a stacked structure including a gate oxide layer, a polysilicon layer, a metal layer, and a gate hard mask layer, and a spacer is provided over a sidewall of the stacked structure between the gate structure and the contact.

The semiconductor device may further include a first interlayer insulating layer provided on two sides of the gate structure.

The first interlayer insulating layer may include a material having etch selectivity higher than an etch selectivity of a material of the spacer.

The first interlayer insulating layer may include an organic material.

The device further comprises a second interlayer insulating layer provided on the interlayer insulating layer and on the gate structure.

The second interlayer insulating layer may include a material selected from the group consisting of a carbon-based material, an oxide-based material, and a nitride-based material.

A voltage sufficient to rupture the gate oxide layer may be applied to the gate structure.

The gate oxide layer may be ruptured at the interface between the active region and the device isolation layer to the maximum when the voltage is applied.

According to another aspect of an embodiment, there is provided a method of forming an antifuse of semiconductor device. The method may include: providing a semiconductor substrate including a device isolation layer and an active region; forming a gate structure to extending across an interface between the device isolation layer and the active region on the semiconductor substrate; forming a contact coupled to at least a portion of the gate structure; and forming a metal interconnection over the contact and the gate structure.

The forming a gate structure may include forming a stacking structure of a gate oxide layer, a polysilicon layer, a metal layer, and a hard mask layer, patterning the stacking structure, and forming a spacer on a sidewall of the patterned stacking structure.

The method may further include forming a first interlayer insulating layer on the gate structure, and etching the first interlayer insulating layer until the gate structure is exposed.

The etching a first interlayer insulating layer may include etching the first interlayer insulating layer through an etch back process or a planarization etch process.

The method may further include forming a second interlayer insulating layer on the first interlayer insulating layer.

The method may further include forming a mask pattern defining a contact hole on the second interlayer insulating layer, and etching the second interlayer insulating layer using the mask pattern as an etch mask to form a contact hole.

The contact hole may be provided on two sides of the gate structure.

The contact holes may have a structure surrounding the gate structure.

The forming a contact may include filling the contact hole with a metal material.

A voltage sufficient to rupture the gate oxide layer may be applied to the gate structure.

The gate oxide layer may be ruptured at the interface between the device isolation layer and the active region to the maximum when the voltage is applied.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
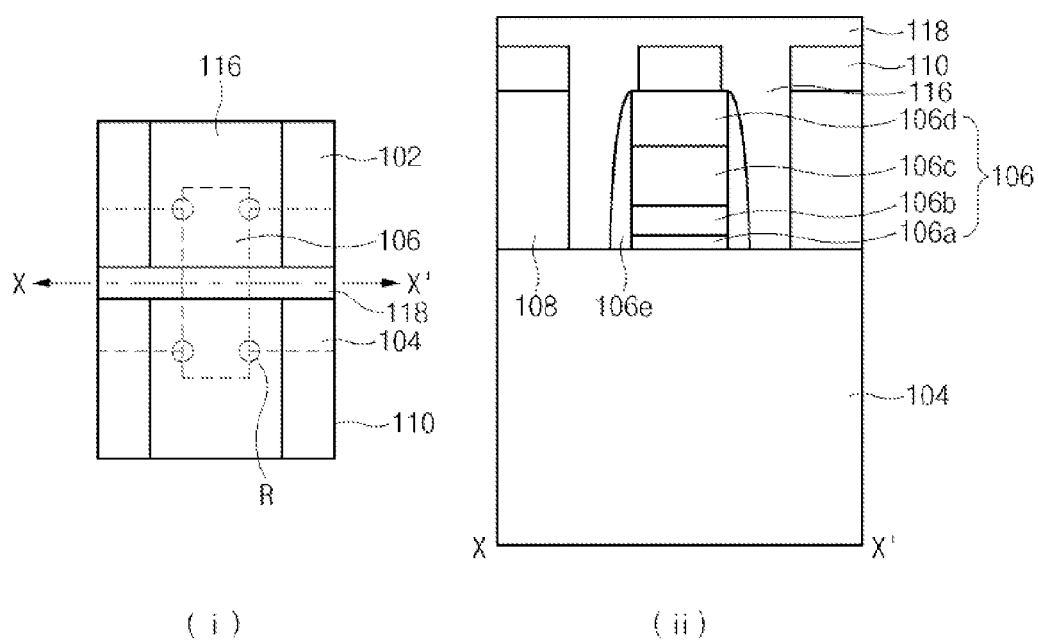
FIG. 1 is a view illustrating a semiconductor device according to a first embodiment of the present invention, wherein (i) shows a plan view of the semiconductor device and (ii) shows a cross-sectional view of the semiconductor device taken along line of x-x' of (i)

Hereinafter, embodiments will be described in greater detail with reference to the accompanying drawings.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIG. 1 is a view illustrating an antifuse unit of a semiconductor device according to a first embodiment of the present invention. FIG. 1 (i) shows a plan view of a semiconductor device and (ii) shows a cross-sectional view of the semiconductor device taken along line of x-x' of (i). Referring to FIG. 1 (i) and (ii), a semiconductor device according to a first embodiment includes a semiconductor substrate including a device isolation layer 102 and an active region 104, a gate structure 106 arranged to pass through an interface between the device isolation layer 102 and the active region 104, a contact 116 surrounding the gate structure 106, and a metal interconnection 118 provided on the contact 116 and the gate structure 106. The configuration may also be described as having a contact 116 surrounding all sidewalls of the gate structure 106. An antifuse unit includes structures related to an antifuse, including all of the structures shown in FIG. 1.

The gate structure 106 may include a stacked structure of a gate oxide layer 106a, a polysilicon layer 106b, a metal layer 106c, a hard mask layer 106d, and a spacer 106e formed on a sidewall of the stacked structure. The semiconductor device may further include a first interlayer insulating layer 108 exposing a top of the gate structure 106, and a second interlayer insulating layer 110 disposed over the first interlayer insulating layer 108. In an embodiment, the first interlayer insulating layer 108 may include a material having an etch selectivity higher than the material used for the spacer 106e. The first interlayer insulating layer 108 may include an organic material containing carbon. The second interlayer insulating layer 110 may include a carbon-based material, an oxide-based material, or a nitride-based material.

A voltage sufficient to rupture the gate oxide layer 106a may be applied to the metal layer 106c. When the voltage is applied, the gate oxide layer 106a is ruptured at the interface between the active region 104 and the device isolation layer 102, indicated by region "R" on FIG. 1 (i). The electric field is concentrated at the interface between the active region 104 and the device isolation layer 102. A gate extending across these junctions increases amount of gate area exposed to the junctions, increasing the reliability of an antifuse operation. In addition, rupture energy flows between contact 116 and gate 106 in a path under the gate 106, so rupture energy may be concentrated at active/isolation junction points at the edges of gate 106, as shown in FIG. 1.

As described above, in the first embodiment, the semiconductor device includes the contact 116 surrounding the gate structure 106 which increases the rupture probability of the gate oxide layer, and thus improves reliability of the semiconductor device.

A method for manufacturing the semiconductor device having the above-described structure will be described with reference to FIGS. 2A to 2F. FIGS. 2A to 2F are cross-sectional views illustrating a method for manufacturing a semiconductor device according to the first embodiment of the present invention. In FIGS. 2A to 2F, (i) shows a plan view of the semiconductor device and (ii) shows a cross-sectional view of the semiconductor device taken along line of x-x' of (i).

Figure 2A:
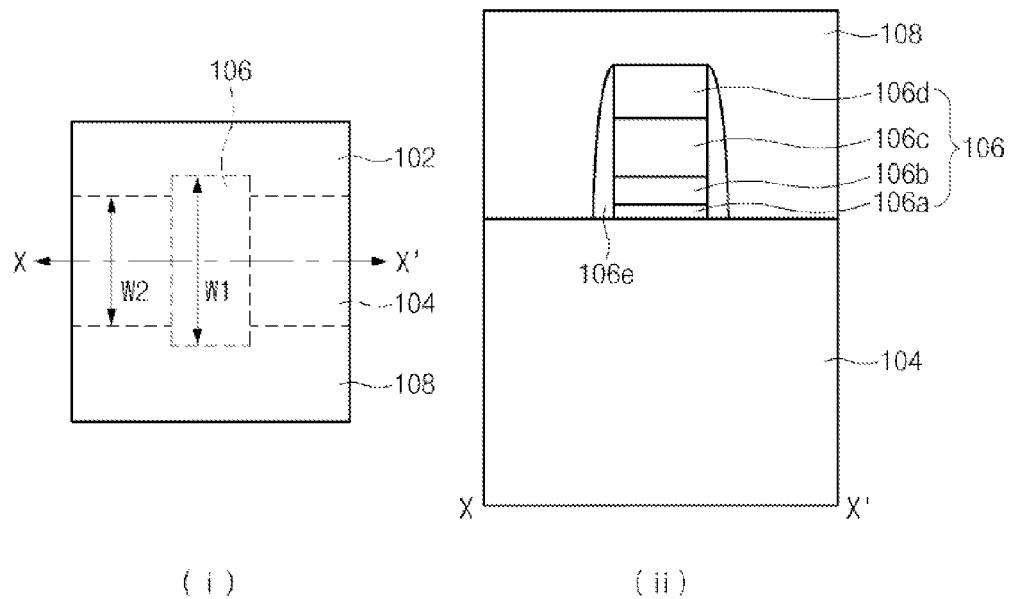
FIGS. 2A to 2F are views illustrating a method for manufacturing the semiconductor device according to the first embodiment of the present invention, wherein (i) shows a plan view of the semiconductor device and (ii) shows a cross-sectional view of the semiconductor device taken along line of x-x' of (i)

Referring to FIG. 2A (i) and (ii), a gate structure 106, which includes a gate oxide layer 106a, a polysilicon layer 106b, a metal layer 106c, and a hard mask layer 106d is formed on a semiconductor substrate including a device isolation layer 102 and an active region 104 and a spacer is formed on a sidewall of gate structure 106. As seen in FIG. 2A, in an embodiment, a width W1 of the gate structure 106 may be larger than a width W2 of the active region 104. That is, the gate structure 106 may be formed to extend through the interface between the device isolation layer 102 and the active region 104. Rupture energy may be concentrated at junctions between the isolation layer 102 and the active region 104. A gate extending across these junctions increases amount of gate area exposed to the junctions, increasing the reliability of an antifuse operation.

Next, a first interlayer insulating layer 108 is formed over the gate structure 106. In an embodiment, the first interlayer insulating layer 108 may include a material having an etch selectivity higher than the spacer so that the spacer material is preserved in a subsequent process of forming a contact hole. The first interlayer insulating layer may include an organic material.

Figure 2B:
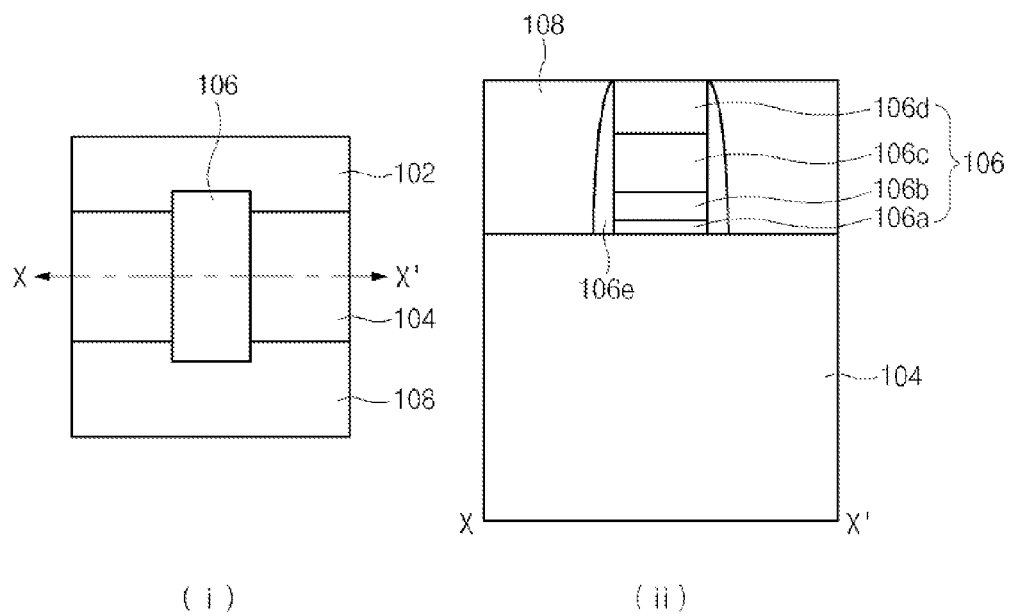

Referring to FIG. 2B (i) and (ii), an etch back process or a planarization etch process is performed on the first interlayer insulating layer 108 until the gate hard mask layer 106d is exposed. This is to cause the contact to be easily separated by the gate structure when the contact hole is formed in a subsequent process and to entirely remove the first interlayer insulating layer in a space between the gate and contact.

Figure 2C:
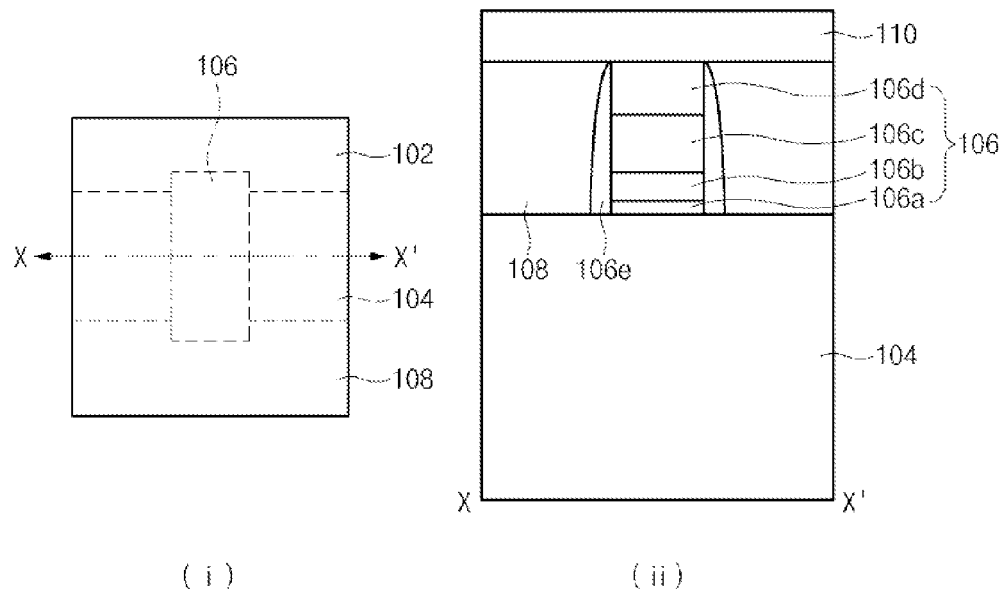

Referring to FIG. 2C (i) and (ii), a second interlayer insulating layer 110 is formed on the first interlayer insulating layer 108 exposing the gate hard mask layer 106d. Here, the second interlayer insulating layer 110 is a layer on which a metal interconnection is formed on the contact to be formed in a subsequent process. The second interlayer insulating layer 110 may include a carbon-based material, an oxide-based material, or a nitride-based material.

Figure 2D:
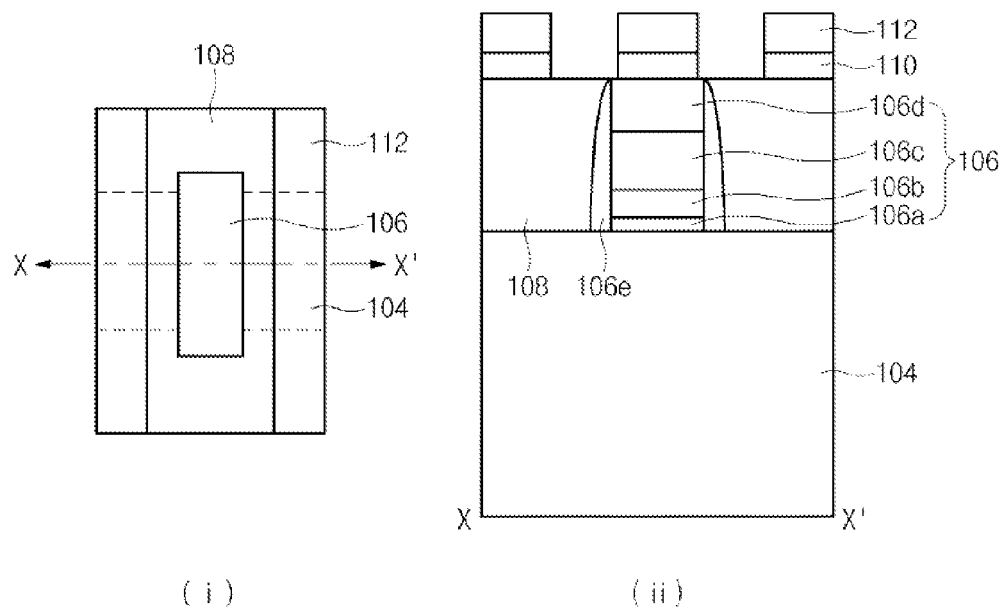

Referring to FIG. 2D (i) and (ii), a mask pattern 112 is formed on the second interlayer insulating layer 110. In an embodiment, the mask pattern 112 may be formed on portions of the second interlayer insulating layer 110 that are separated from the gate structure 106 by a space that is a contact region for a contact formed in a subsequent process. In other words, the mask pattern 112 may be formed over portions of the second interlayer insulating layer 110, but not formed over the gate structure 106. Subsequently, the second interlayer insulating layer 110 is etched using the mask pattern 112 as an etch mask until the first interlayer insulating layer 108 is exposed.

Figure 2E:
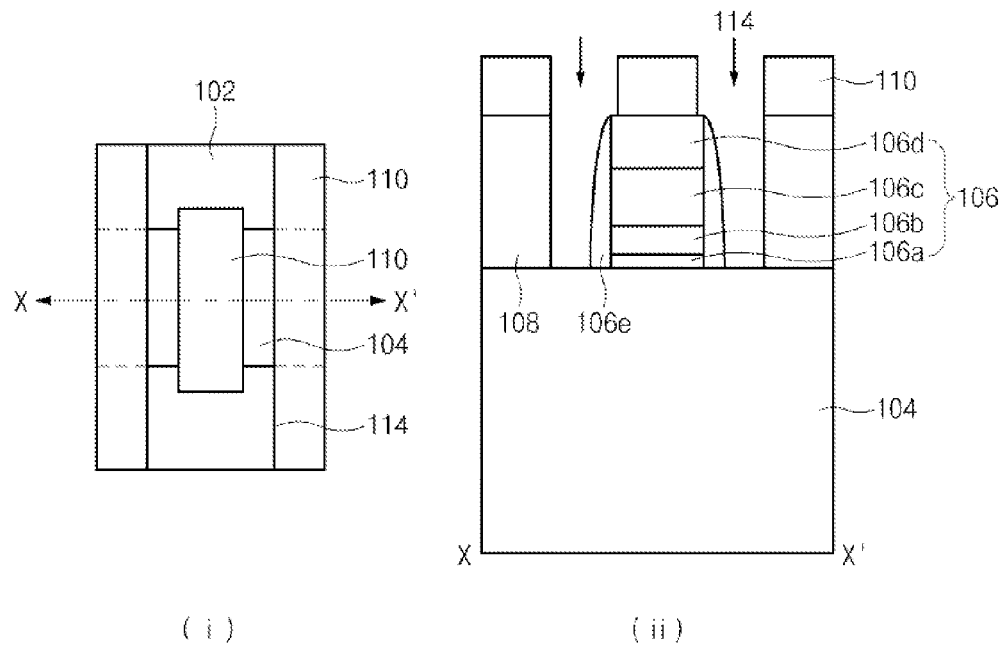

Referring to FIG. 2E (i) and (ii), the first interlayer insulating layer 108 is etched using the second interlayer insulating layer 110 as a mask to form a contact hole 114 exposing the active region 104 and the device isolation layer 102. In an embodiment, as shown for example in FIG. 2F, the contact hole may have a shape surrounding the gate structure 106.

Figure 2F:
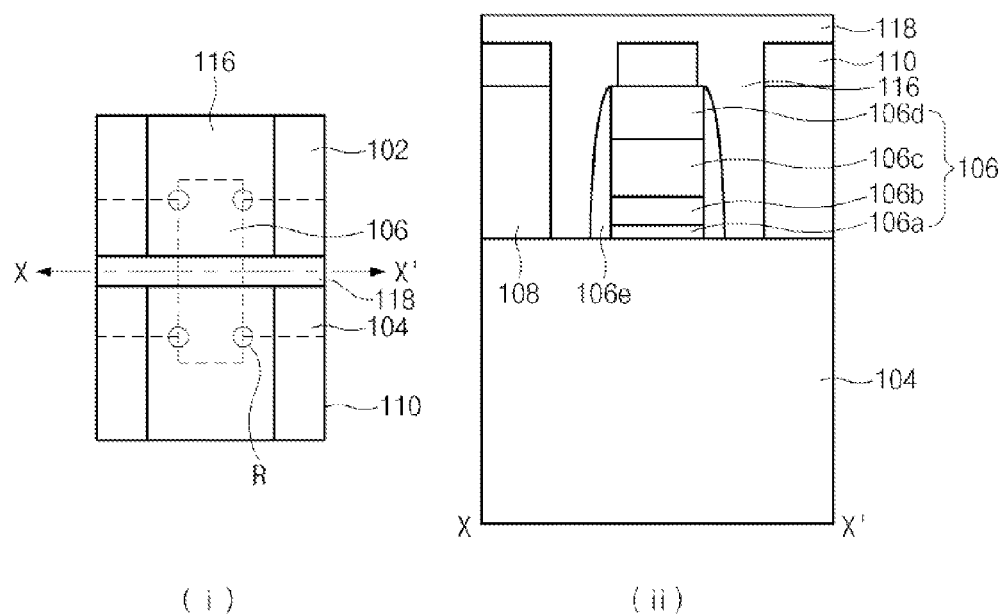

Referring to FIG. 2F (i) and (ii), a conductive material is formed in contact hole 114, thereby forming a contact 116 and a metal interconnection 118 passing central portions of the contact 116 and active region 104. Metal interconnection 118 may be elevated above contact 116, for example by patterning and etching the conductive material. In an embodiment, the contact 116 has a shape surrounding the gate structure 106. That is, in an embodiment according to the present invention, a distance between the gate structure 106 and the contact 116 is shorter than the related art.

A voltage sufficient to rupture the insulating layer may be applied to a metal contact (not shown) connected to an edge of the gate structure 106. When the voltage is applied, the gate oxide layer 106a is ruptured. The rupture energy of the gate oxide layer is maximized at a portion R adjacent to the interface between the active region 104 and the device isolation layer 102. That is, a ruptured area of the gate oxide layer 106a is increased which increases the probability of a successful antifuse operation so that reliability of the semiconductor device is improved.

In the above-described first embodiment, the antifuse of the semiconductor device includes a contact entirely surrounding the gate structure. However, embodiments of the present invention are not limited to such a configuration. The following second embodiment is another example of a contact configuration according to the present invention.

Figure 3:
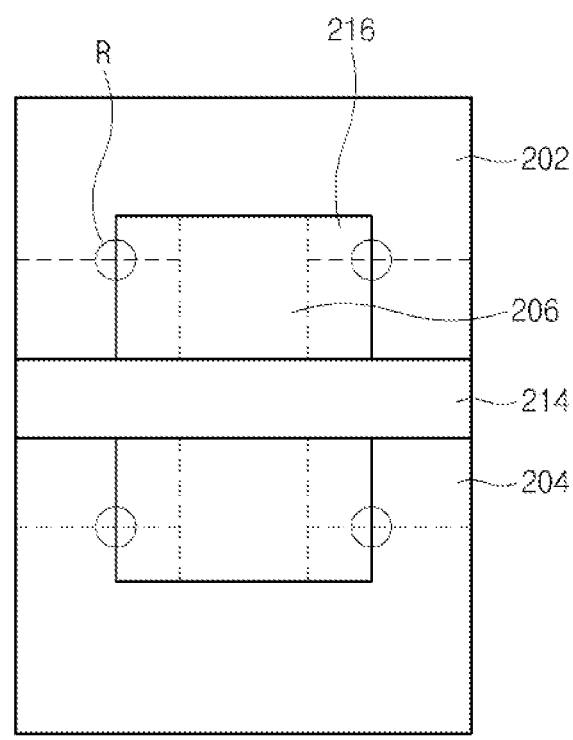
FIG. 3 is a cross-sectional view illustrating a semiconductor device according to a second embodiment.

FIG. 3 is a view illustrating an antifuse of a semiconductor device according to a second embodiment. Referring to FIG. 3, a semiconductor device according the second embodiment includes a gate structure 206 provided on a semiconductor substrate including a device isolation layer 202 and an active region 204, contacts 216 provided on two sides of the gate structure 206, and a metal interconnection 214 provided on the contacts 216 and the gate structure 206. In an embodiment, the gate structure 206 extends across at least one interface between the device isolation layer 202 and the active region 204.

A voltage sufficient to rupture an insulating layer included in the gate structure 206 may be applied to a metal contact (not shown) connected to an edge of the gate structure 206. When a rupture voltage is applied, the gate oxide layer included in the gate structure is ruptured. The rupture of the gate oxide layer is maximized at a portion R adjacent to the interface between the active region 204 and the device isolation layer 202. That is, the gate structure 206 extends across an interface between an active region and an isolation layer, so an area of the gate oxide layer 106a exposed to a high energy concentration is high, so that the rupture probability is increased and reliability of the semiconductor device is improved.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device with an antifuse unit, the antifuse unit comprising:
   a semiconductor substrate including a device isolation layer and an active region;
   a gate structure extending across an interface between the device isolation layer and the active region, the gate structure including a layer that is configured to be ruptured in an antifuse operation;
   a contact surrounding all sidewalls of the gate structure; and
   a metal interconnection provided on the contact and the gate structure.

2. The semiconductor device of claim 1, wherein the gate structure includes a stacked structure including a gate oxide layer, a polysilicon layer, a metal layer, and a gate hard mask layer, and a spacer is provided over a sidewall of the stacked structure between the gate structure and the contact.

3. The semiconductor device of claim 2, wherein a voltage sufficient to rupture the gate oxide layer is applied to the gate structure.

4. The semiconductor device of claim 3, wherein the gate oxide layer is ruptured at the interface between the active region and the device isolation layer when the voltage is applied.

5. The semiconductor device of claim 1, wherein the antifuse unit further comprises a first interlayer insulating layer provided on two sides of the gate structure.

6. The semiconductor device of claim 5, wherein the first interlayer insulating layer includes a material having etch selectivity higher than an etch selectivity of a material of the spacer.

7. The semiconductor device of claim 5, wherein the first interlayer insulating layer includes an organic material.

8. The semiconductor device of claim 5, wherein the antifuse unit further comprises a second interlayer insulating layer provided on the first interlayer insulating layer and on the gate structure.

9. The semiconductor device of claim 8, wherein the second interlayer insulating layer includes a material selected from the group consisting of a carbon-based material, an oxide-based material, and a nitride-based material.

10. The semiconductor device of claim 1, wherein the contact extends over the device isolation layer and the active region.

11. The semiconductor device of claim 1, wherein the contact is contiguous and encloses the sidewalls of the gate structure.

12. The semiconductor device of claim 1, wherein the metal interconnection is contiguous with the contact.

13. The semiconductor device of claim 1, wherein the contact has a ring shape.

14. The semiconductor device of claim 1, wherein the contact has a closed loop shape.

* * * * *